(12) United States Patent
Khamehchi

(10) Patent No.: US 12,743,032 B2
(45) Date of Patent: Sep. 22, 2026

(54) APPARATUS FOR AND METHOD OF VIBRATION CANCELLATION FOR LASER WAVELENGTH AND BANDWIDTH STABILITY

(71) Applicant: Cymer, LLC, San Diego, CA (US)

(72) Inventor: Mohammad Amin Khamehchi, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 70 days.

(21) Appl. No.: 18/849,097

(22) PCT Filed: Mar. 13, 2023

(86) PCT No.: PCT/US2023/015105
§ 371 (c)(1),
(2) Date: Sep. 20, 2024

(87) PCT Pub. No.: WO2023/196087
PCT Pub. Date: Oct. 12, 2023

(65) Prior Publication Data

US 2025/0208525 A1 Jun. 26, 2025

Related U.S. Application Data

(60) Provisional application No. 63/328,943, filed on Apr. 8, 2022.

(51) Int. Cl.
*G03F 7/00* (2006.01)

(52) U.S. Cl.
CPC ............ *G03F 7/709* (2013.01); *G03F 7/7085* (2013.01)

(58) Field of Classification Search
CPC .... G03F 7/709; G03F 7/7085; G03F 7/70575; F16F 15/005
See application file for complete search history.

(56) References Cited

U.S. PATENT DOCUMENTS 4,703,166 A 10/1987 Bruning et al.
6,999,162 B1 2/2006 Takahashi et al.
(Continued)

FOREIGN PATENT DOCUMENTS

JP 2006153129 A 6/2006
JP 4493484 B2 6/2010
(Continued)

OTHER PUBLICATIONS

Apparatus for and Method of Vibration Cancellation for Laser Wavelength and Bandwidth Stability,Research Disclosure, Kenneth Mason Publications, Hampshire, UK, GB, vol. 700, No. 28 Jul. 1, 2022 (Jul. 1, 2022 ), XP00715044C, ISSN: 0374-4353.
(Continued)

*Primary Examiner* — Hung V Nguyen
(74) *Attorney, Agent, or Firm* — DiBerardino McGovern IP Group LLC

(57) ABSTRACT

An apparatus for and method of reducing the effects of vibrations on components in modules of a deep ultraviolet light source. The components are provided with sensors (325,335) to sense vibration waveforms and actuators (320, 330) for applying a waveform opposed to and so cancelling the vibration waveform. In addition to application of active noise (vibration) cancellation the vibration waveform resulting from active vibration suppression is analyzed to identify residual vibrations to determine characteristics of a residual vibration cancelling waveform.

18 Claims, 8 Drawing Sheets

(56) References Cited

U.S. PATENT DOCUMENTS

| | | | | |
|---|---|---|---|---|
| 7,072,777 | B1 | 7/2006 | Wakui et al. | |
| 8,245,824 | B2 * | 8/2012 | Butler | F16F 15/002 355/53 |
| 9,665,012 | B2 * | 5/2017 | Hulsebos | G03F 7/709 |
| 11,803,126 | B2 * | 10/2023 | Teng | G03F 7/70575 |
| 12,019,197 | B2 * | 6/2024 | Faber | G01P 15/097 |
| 2002/0141471 | A1 | 10/2002 | Aab et al. | |
| 2002/0149754 | A1 | 10/2002 | Auer et al. | |
| 2002/0154669 | A1 * | 10/2002 | Spangler | G03F 7/70041 372/55 |
| 2004/0189145 | A1 | 9/2004 | Pletner et al. | |
| 2005/0265417 | A1 | 12/2005 | Fallon et al. | |
| 2011/0171759 | A1 | 7/2011 | Butler et al. | |

FOREIGN PATENT DOCUMENTS

| | | | |
|---|---|---|---|
| TW | 202004354 | A | 1/2020 |
| WO | 2019182728 | A1 | 9/2019 |

OTHER PUBLICATIONS

Makiharka et al: " Investigation of performance in suppressing various vibrations with energy-recycling semi-active method", Acta Astronautica, Pergamon Press, Elmsford, GB, vol. 58, No. 10, May 1, 2006 (2006-OS-01), pp. 506-514.

N.N "TMC Resource Guide 12", Dec. 31, 2012 pp. 1-124.

Wiebo van Toledo, European International Searching Authority, International Search Report and Written Opinion issued Jun. 5, 2023 in PCT/US2023/015105, 14 total pages.

* cited by examiner

APPARATUS FOR AND METHOD OF VIBRATION CANCELLATION FOR LASER WAVELENGTH AND BANDWIDTH STABILITY

CROSS-REFERENCE TO RELATED APPLICATIONS

This application is the U.S. National Stage Application of International Patent Application No. PCT/US2023/015105, filed on Mar. 13, 2023, which claims priority to U.S. Application No. 63/328,943, filed Apr. 8, 2022, titled APPARATUS FOR AND METHOD OF VIBRATION CANCELLATION FOR LASER WAVELENGTH AND BANDWIDTH STABILITY, which is incorporated herein in its entirety by reference.

TECHNICAL FIELD

The disclosed subject matter relates to systems in which some components of a laser system for carrying out photolithographic integrated circuit manufacturing processes may benefit from the use of antivibration systems and methods. The disclosed subject matter is related, for example, to deep ultraviolet ("DUV") laser line narrowing modules ("LNMs") having center wavelength selection optical elements which are either movable or have some flexure in the mounting, or both.

BACKGROUND

Photolithography is a process by which semiconductor circuitry is patterned on a substrate such as a silicon wafer. A photolithography optical source provides the DUV light used to expose a photoresist on the wafer. Often, the optical source is a laser source and the light is a pulsed laser beam. The light beam is passed through a beam delivery unit, then a reticle or a mask, and then projected onto a prepared silicon wafer. In this way, a chip design is patterned onto a photoresist that is then etched and cleaned, and then the process repeats.

In many systems that produce a laser beam (such as a laser generator) or employ a laser beam (such as a photolithography system), there is an optical train that includes one or more optical components (such as mirrors, gratings, prisms, optical switches, filters, etc.) often contained in modules. Optical components of the optical train may, wholly or partially, reflect, process, filter, modify, focus, expand, etc. the laser beam to obtain one or more desired laser beam outputs.

One optical component in the optical train is a line narrowing module, LNM, also known as a line narrowing package or "LNP." The line narrowing module is positioned and adapted to select a desired center wavelength around a narrow band of wavelengths, with the bandwidth of the narrow band also being carefully selected ordinarily to be of as narrow a bandwidth as possible, e.g., for lithography uses where chromatic aberrations in the lenses of a scanning lithography photoresist exposure apparatus can be critical. The bandwidth is also selected to be within some range of bandwidths, i.e., neither too large nor too small, also, e.g., for photolithography reasons, e.g., for optimizing and enabling modern optical proximity correction techniques commonly used in preparing masks such as reticles.

It is also well known that such LNMs may employ a variety of center wavelength selection optical elements, usually of the dispersive variety, which can reflect back into the optical path of, e.g., the laser oscillating resonance chamber light of the selected center wavelength and of a narrowed bandwidth, depending on a number of physical parameters of the LNM and optical parameters and performance capabilities of the wavelength selective optical element, e.g., a dispersive optical element.

The optical components within the LNM have to be isolated as much a practical from external sources of mechanical vibration in order to function well. These vibrations can be regarded as acoustic vibrations or noise so that mitigating such vibrations can be regarded as noise control or cancellation. These vibrations unless controlled can cause instabilities in both or either center wavelength and/or bandwidth. Vibration modes may be amplified by resonant conditions of various laser structures including the LNM and its components.

As a specific example, the LNM may include one or more prisms which may be mounted within the LNM using a flexure mounting. Prisms thus mounted are susceptible to vibration which can be detrimental to center wavelength control and/or stability and adversely impact bandwidth control as well. There are multiple pathways for the vibrations to reach the LNM, including through a bellows that is used to surround an actuator arm coupled to components inside the LNM. Vibrations can also reach the LNM through connections to the laser chassis, including a post connection.

Passive vibration control systems such as damping mechanisms may be employed to lessen the effect of vibration on the prism positioning. A passive isolation system still permits some levels of vibration from the main chassis and chamber to affect the LNM. It is also known to use active vibration/noise control systems that sense a waveform of incident noise or vibration and generate a cancelling waveform that counters the incident waveform.

Improved wavelength and bandwidth stability apparatuses and methods are subjects of embodiments of the subject matter herein.

SUMMARY

The following presents a succinct summary of one or more embodiments in order to provide a basic understanding of the present invention. This summary is not an extensive overview of all contemplated embodiments and is not intended to identify key or critical elements of all embodiments nor delineate the scope of any or all embodiments. Its sole purpose is to present some concepts of one or more embodiments in a streamlined form as a prelude to the more detailed description that is presented later.

According to one aspect of an embodiment, there is disclosed an antivibration apparatus for a module for a lithography system, the module having a chassis, the antivibration apparatus comprising a first piezo-mass member mechanically coupled to the chassis to be accelerated in a first direction by a vibration waveform vibrating the chassis and adapted to generate a signal indicative of a component of the vibration waveform in the first direction, a controller arranged to receive the signal and adapted to generate a first vibration suppression waveform based at least in part on the signal, and a second piezo-mass member mechanically coupled to the chassis and arranged to receive the first vibration suppression waveform and adapted to apply a first antivibration force to the chassis in the first direction in accordance with the first vibration suppression waveform.

The antivibration apparatus may further comprise a third piezo-mass member mechanically coupled to the chassis to be accelerated in a second direction by the vibration waveform vibrating the chassis and adapted to generate a second signal indicative of a component of the vibration waveform in the second direction, the controller being arranged to receive the second signal and adapted to generate a second vibration suppression waveform based at least in part on the second signal, and a fourth piezo-mass member mechanically coupled to the chassis and arranged to receive the second vibration suppression waveform and adapted to apply a second antivibration force to the chassis in the second direction in accordance with the second vibration suppression waveform.

The first direction and the second direction may be substantially orthogonal.

The antivibration apparatus may further comprise a fifth piezo-mass member mechanically coupled to the chassis to be accelerated in a third direction by the vibration waveform vibrating the chassis and adapted to generate a third signal indicative of a component of the vibration waveform in the third direction, the controller being arranged to receive the third signal and adapted to generate a third vibration suppression waveform based at least in part on the third signal, and a sixth piezo-mass member mechanically coupled to the chassis and arranged to receive the third vibration suppression waveform and adapted to apply a third antivibration force to the chassis in the third direction in accordance with the third vibration suppression waveform.

The first direction, the second direction, and the third direction may be substantially mutually orthogonal.

The controller may be adapted to analyze a residual vibration component of the signal present while the second piezo-mass member applies the antivibration force and to modify the first vibration suppression waveform to reduce the residual vibration component. Each of the piezo-mass members may comprise a piezoelectric crystal and a seismic mass.

According to another aspect of an embodiment, there is disclosed an antivibration apparatus for a module for a lithography system, the module having a chassis, the antivibration apparatus comprising a first sensor mechanically coupled to the chassis and arranged to sense a first directional component of a vibration waveform in a first direction and to generate a first output indicative of the first directional component, a second sensor mechanically coupled to the chassis and arranged to sense a second directional component of a vibration waveform in a second direction different from the first direction and to generate a second output indicative of the second directional component, and a cancellation waveform generator arranged to receive the first output and the second output and to generate a first vibration cancellation waveform for the first direction based at least in part on the first output and a second vibration cancellation waveform for the second direction based at least in part on the second output.

The apparatus also includes a first actuator mechanically coupled to the chassis and arranged to receive the first vibration cancellation waveform and to generate first cancellation vibrations corresponding to the first vibration cancellation waveform in the first direction and a second actuator mechanically coupled to the chassis and arranged to receive the second vibration cancellation waveform and to generate second cancellation vibrations corresponding to the second vibration cancellation waveform in the second direction.

The antivibration system further comprises a residual vibration cancellation waveform generator arranged to receive the first output and the second output, adapted to identify a first residual vibration waveform for the first direction based at least in part on the first output while the first cancellation vibration is being generated and generate a first residual vibration suppression waveform based at least in part on the first residual vibration waveform and to add the first residual vibration waveform to the first vibration cancellation waveform, and adapted to identify a second residual vibration waveform for the second direction based at least in part on the second output while the second cancellation vibration is being generated and generate a second residual vibration suppression waveform based at least in part on the second residual vibration waveform and to add the second residual vibration waveform to the second vibration cancellation waveform.

The first sensor may comprise a first sensor piezoelectric transducer and the second sensor may comprise a second sensor piezoelectric transducer.

The first sensor piezoelectric transducer and the second sensor piezoelectric transducer each may comprise a piezoelectric crystal and a seismic mass. The first actuator may comprise a first piezoelectric transducer and the second actuator may comprise a second piezoelectric transducer. The first piezoelectric transducer and the second piezoelectric transducer each may comprise a piezoelectric crystal and a seismic mass. The module may comprise a line narrowing module.

The residual vibration cancellation waveform generator may be adapted to identify the first residual vibration waveform by analyzing a wavelength of the first output in wavelength sigma and to identify the second residual vibration waveform by analyzing a wavelength of the second output in wavelength sigma.

The first direction may be orthogonal to the second direction.

The apparatus may further comprise a third sensor mechanically coupled to the chassis and arranged to sense a third directional component of a vibration waveform in a third direction different from the first direction and the second direction and to generate a third output indicative of the third directional component, the cancellation waveform generator being arranged to receive the third output and to generate a third vibration cancellation waveform for the third direction based at least in part on the third output. The apparatus also includes a third actuator mechanically coupled to the chassis and arranged to receive the third vibration cancellation waveform and to generate third cancellation vibrations corresponding to the third vibration cancellation waveform in the third direction, the residual vibration cancellation waveform generator being arranged to receive the third output, adapted to identify a third residual vibration waveform for the third direction based at least in part on the third output while the third cancellation vibration is being generated and generate a third residual vibration suppression waveform based at least in part on the third residual vibration waveform and to add the third residual vibration waveform to the third vibration cancellation waveform.

According to another aspect of an embodiment there is disclosed an antivibration method for a module for a lithography system, the module having a chassis, the antivibration method comprising sensing a first directional component of a vibration waveform in a first direction and generating a first output indicative of the first directional component, sensing a second directional component of a vibration waveform in a second direction different from the first direction and generating a second output indicative of the second directional component, generating a first vibration cancellation waveform for the first direction based at least in part on the first output and a second vibration cancellation waveform for the second direction based at least in part on the second output, generating first cancellation vibrations in the first direction corresponding to the first vibration cancellation waveform, and generating second cancellation vibrations in the second direction corresponding to the second vibration cancellation waveform.

The method also includes identifying a first residual vibration waveform for the first direction based at least in part on the first output while the first cancellation vibration is being generated and generating a first residual vibration suppression waveform based at least in part on the first residual vibration waveform and adding the first residual vibration waveform to the first vibration cancellation waveform and identifying a second residual vibration waveform for the second direction based at least in part on the second output while the second cancellation vibration is being generated and generating a second residual vibration suppression waveform based at least in part on the second residual vibration waveform and adding the second residual vibration waveform to the second vibration cancellation waveform.

Sensing the first directional component of the vibration waveform in the first direction and generating the first output indicative of the first directional component may be performed using a first piezoelectric transducer and wherein sensing the second directional component of the vibration waveform in the second direction and generating the second output indicative of the second directional component is performed using a second piezoelectric transducer.

Generating the first cancellation vibrations in the first direction may be performed using a first piezoelectric transducer and wherein generating second cancellation vibrations in the second direction is performed using a second piezoelectric transducer.

Identifying the first residual vibration waveform may comprise analyzing a wavelength of the first output in wavelength sigma and wherein identifying the second residual vibration waveform may comprise analyzing a wavelength of the second output in wavelength sigma.

The first direction may be orthogonal to the second direction.

The method may further comprise sensing a third directional component of a vibration waveform in a third direction different from the first direction and the second direction and generating a third output indicative of the third directional component, generating a third vibration cancellation waveform for the third direction based at least in part on the third output, and generating third cancellation vibrations corresponding to the third vibration cancellation waveform in the third direction. The method may further comprise identifying a third residual vibration waveform for the third direction based at least in part on the third output while the third cancellation vibration is being generated and generating a third residual vibration suppression waveform based at least in part on the third residual vibration waveform and to add the third residual vibration waveform to the third vibration cancellation waveform.

Further embodiments, features, and advantages of the subject matter of the present disclosure, as well as the structure and operation of the various embodiments, are described in detail below with reference to the accompanying drawings.

BRIEF DESCRIPTION OF THE DRAWINGS

The accompanying drawings, which are incorporated herein and form part of the specification, illustrate the present invention and, together with the description, further serve to explain the principles of the present invention and to enable a person skilled in the relevant art(s) to make and use the present invention.

Figure 1:
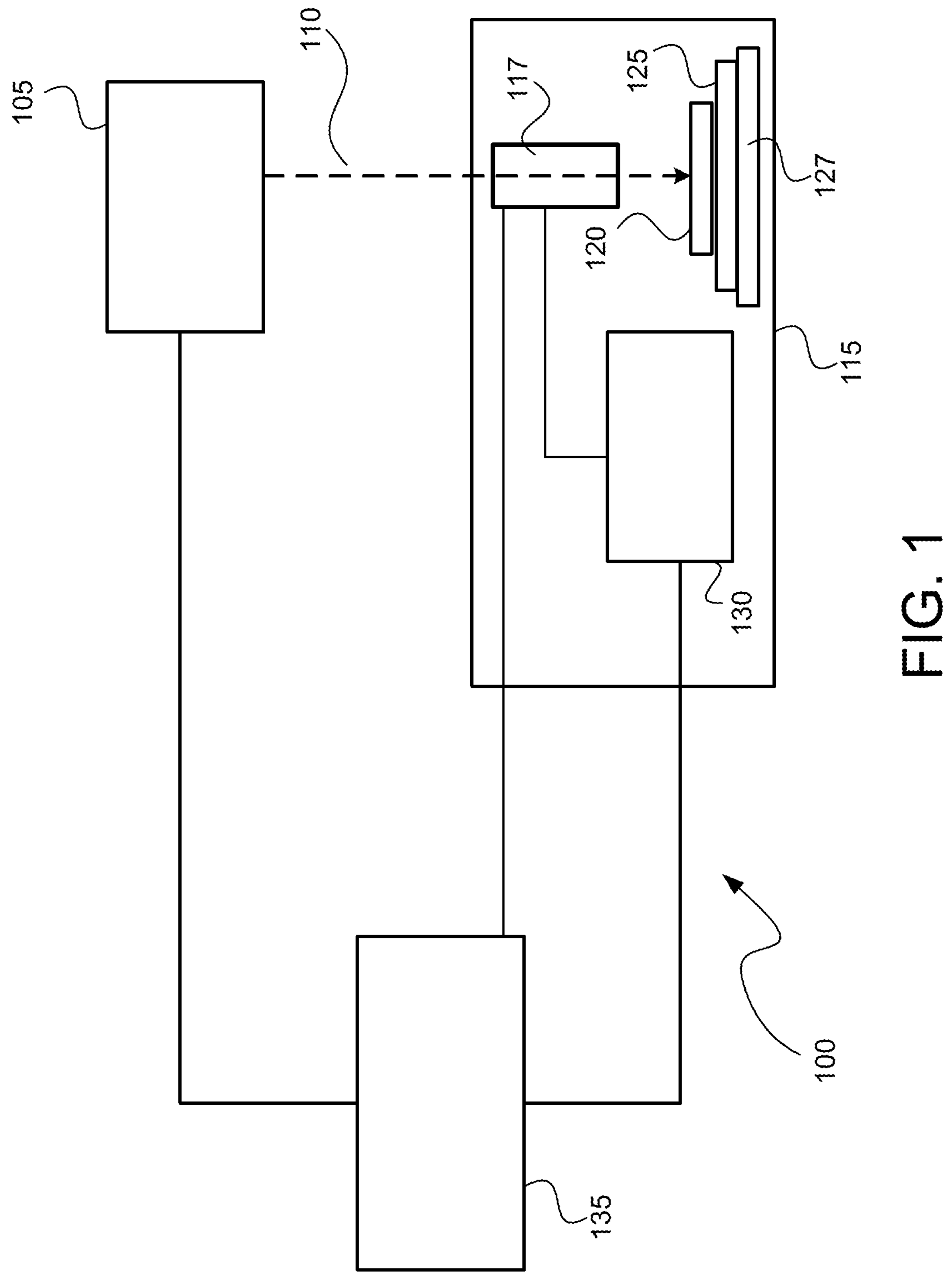
FIG. 1 is a schematic diagram, not to scale, of an overall broad conception of a photolithography system.

Further features and advantages of the invention, as well as the structure and operation of various embodiments of the invention, are described in detail below with reference to the accompanying drawings. It is noted that the scope of the invention is not limited to the specific embodiments described herein. Such embodiments are presented herein for illustrative purposes only. Additional embodiments will be apparent to persons skilled in the relevant art based on the teachings presented herein.

DETAILED DESCRIPTION

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be practiced without adopting the specific design details described below. In other instances, well-known structures and devices are shown in block diagram form in order to facilitate description of one or more embodiments. This summary is not an extensive overview of all contemplated embodiments and is not intended to single out key or critical elements of all embodiments nor delineate the scope of any or all embodiments.

Systems such as those described herein may render benefits in a wide range of applications and implementations. For the sake of having a specific nonlimiting example to facilitate description, one such application is in semiconductor photolithography. FIG. 1 shows a photolithography system 100 that includes an illumination system 105. As described more fully below, the illumination system 105 includes a light source that produces a pulsed light beam 110 and directs it to a photolithography exposure apparatus or scanner 115 that patterns microelectronic features on a wafer 120. The wafer 120 is placed on a wafer table 125 constructed to hold wafer 120 and connected to a positioner 127 configured to accurately position the wafer 120 in accordance with certain parameters.

The pulsed light beam 110 may have a wavelength in the DUV range, for example, with a wavelength of 248 nanometers (nm) or 193 nm. The scanner 115 includes an optical arrangement 117 having, for example, one or more condenser lenses, a mask, and an objective arrangement. The mask is movable along one or more directions, such as along an optical axis of the pulsed light beam 110 or in a plane that is perpendicular to the optical axis. The objective arrangement includes a projection lens and enables an image transfer to occur from the mask to photoresist on the wafer 120. The illumination system 105 adjusts the range of angles for the pulsed light beam 110 impinging on the mask. The illumination system 105 also homogenizes (makes uniform) the intensity distribution of the pulsed light beam 110 across the mask.

The scanner 115 can include, among other features, a lithography controller 130 that controls how layers are printed on the wafer 120. The lithography controller 130 may include a memory that stores information such as process recipes that determine the parameters including a length of the exposure on the wafer 120 based on, for example, the mask used, as well as other factors that affect exposure. During lithography, a burst of pulses of the pulsed light beam 110 illuminates the same area of the wafer 120 to constitute an illumination dose.

The photolithography system 100 also preferably includes a control system 135. In general, the control system 135 includes one or more of digital electronic circuitry, computer hardware, firmware, and software. The control system 135 can be centralized or be partially or wholly distributed throughout the photolithography system 100.

Figure 2:
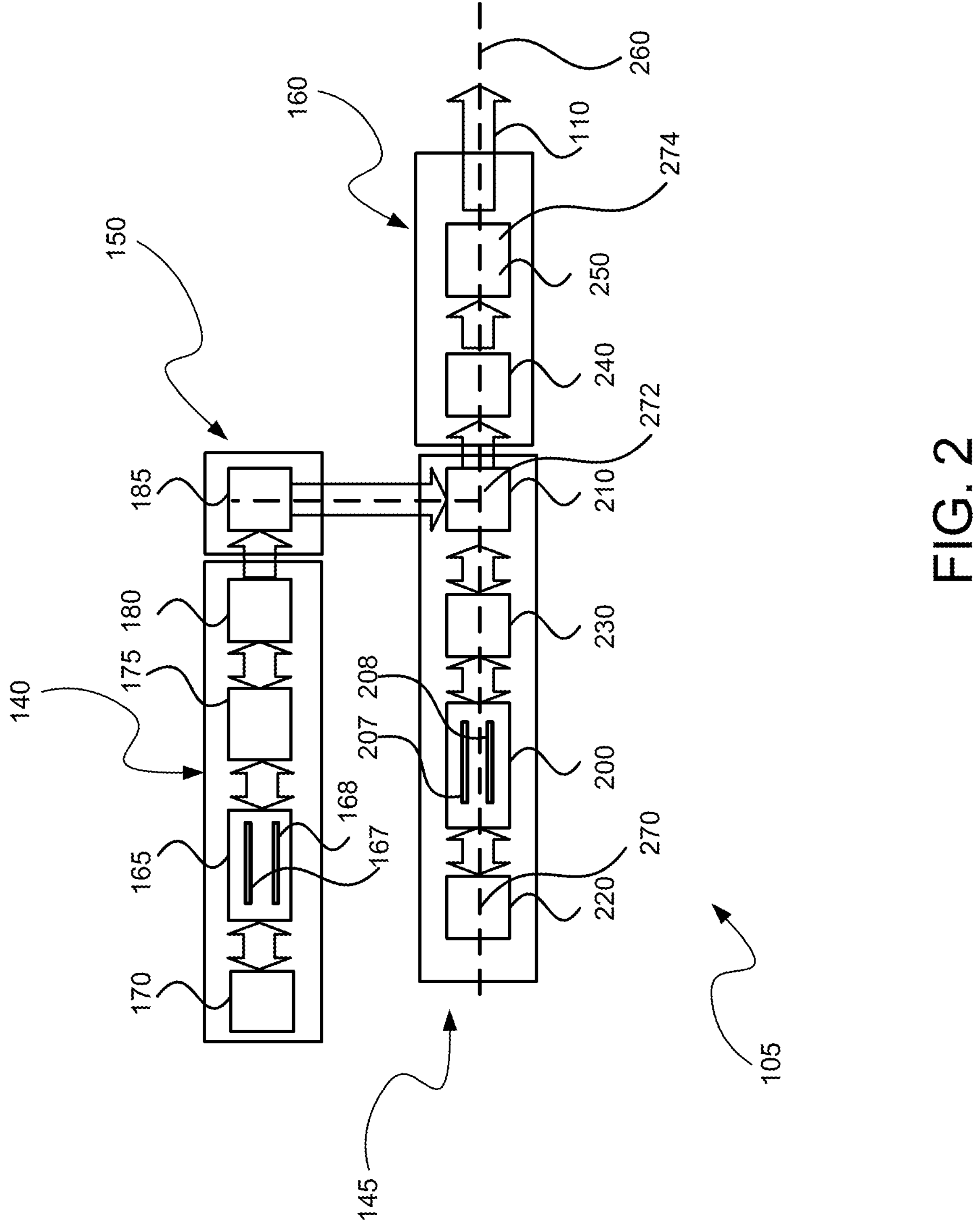
FIG. 2 is a schematic diagram, not to scale, of an overall broad conception of an illumination system such as might be used in the photolithography system of FIG. 1.

FIG. 2 shows a pulsed laser source that produces a pulsed laser beam as the light beam 110 as an example of an illumination system 105. FIG. 2 shows a two-chamber laser system as a nonlimiting example but it will be understood that the principles explained herein are equally applicable to a single chamber laser system or a laser system having more than two chambers. The gas discharge laser system may include, e.g., a solid state or gas discharge master oscillator ("MO") seed laser system 140, an amplification stage, e.g., a power ring amplifier ("PRA") stage 145, relay optics 150, and laser system output subsystem 160. The seed system 140 may include, e.g., an MO chamber 165 which includes a pair of electrodes 167 and 168.

The MO seed laser system 140 may also include a master oscillator output coupler ("MO OC") 175, which may comprise a partially reflective mirror, forming an MO 165 with an oscillator cavity defined by a reflective grating (not shown) in an LNM 170 that oscillates to form the seed laser output pulse. The MO seed laser system 140 may also include a line-center analysis module ("LAM") 180. A MO wavefront engineering box ("WEB") 185 may serve to redirect the output of the MO seed laser system 140 toward the amplification stage 145, and may include, e.g., a multi prism beam expander (not shown) and an optical delay path (not shown).

The amplification stage 145 may include, e.g., a PRA lasing chamber 200, which also may be an oscillator, e.g., formed by seed beam injection and output coupling optics (not shown) that may be incorporated into a PRA WEB 210. The beam may be redirected back through the gain medium in the chamber 200 by a beam reverser ("BR") 220. The PRA WEB 210 may incorporate a partially reflective input/output coupler (not shown) and a maximally reflective mirror for the nominal operating wavelength (e.g., at around 193 nm for an ArF system) and one or more prisms. The PRA lasing chamber 200 may also include a pair of electrodes 207 and 208.

A bandwidth analysis module ("BAM") 230 may receive the output laser light beam of pulses from PRA lasing chamber 200 and pick off a portion of the light beam for metrology purposes, e.g., to measure the output bandwidth and pulse energy. The laser output light beam of pulses then passes through the PRA WEB 210 to an optical pulse stretcher ("OPuS") 240 and an autoshutter, in this case a combined autoshutter metrology module ("CASMM") 250, which may also be the location of a pulse energy meter. One purpose of the OPUS 240 may be, e.g., to convert a single output laser pulse into a pulse train. Secondary pulses created from the original single output pulse may be delayed with respect to each other. By distributing the original laser pulse energy into a train of secondary pulses, the effective pulse length of the laser can be expanded and at the same time the peak pulse intensity reduced. The OPUS 240 may accordingly be arranged to receive the laser beam from the PRA WEB 210 and direct its output to the CASMM 250.

The PRA lasing chamber 200 and the MO 165 are configured as chambers in which electrical discharges between the electrodes cause lasing gas discharges in a lasing gas to create an inverted population of high energy molecules, including, e.g., Ar, Kr, $F_2$, and/or Xe, to produce relatively broad band radiation that may be line narrowed to a relatively very narrow bandwidth and center wavelength selected in the LNM 170.

Systems such as those just described may be conceptualized as a collection of several modules, each of which may include one or more optical components such as prisms, folding mirrors, and the like.

As mentioned, systems to prevent vibrations from impairing the performance of components such as the prisms and grating in the LNM may include passive measures such as dampeners and active measures which set up waveforms opposed to the waveforms of the vibrations. Even when such systems are used, however residual vibrations remain that can still impair operation.

In accordance with an aspect of an embodiment, disclosed herein is an antivibration system for an optical component in which vibrations are measured in at least two dimensions by a corresponding number of sensors and in which residual vibrations which persist even after active noise cancellation are identified and neutralized by a corresponding number of actuators. According to an aspect of an advantageous embodiment, there may be three sensor-actuator pairs operating in mutually perpendicular directions to reduce cross-talk. In the example below the three directions are labelled X, Y, and Z. It will be understood that the directions X, Y, and Z are chosen to be coincident with the axes of the LNM rather than any external absolute coordinate system. It will also be understood that the axes do not have to be so coincident. Also, it will be understood that the term "direction" in this context refers to movement both forwards and back in that direction, e.g., "in the X direction" refers to both movement in the +X and −X direction. Similarly, for example, "movement in a first direction" refers to movement both forwards and back in that direction.

Figure 3:
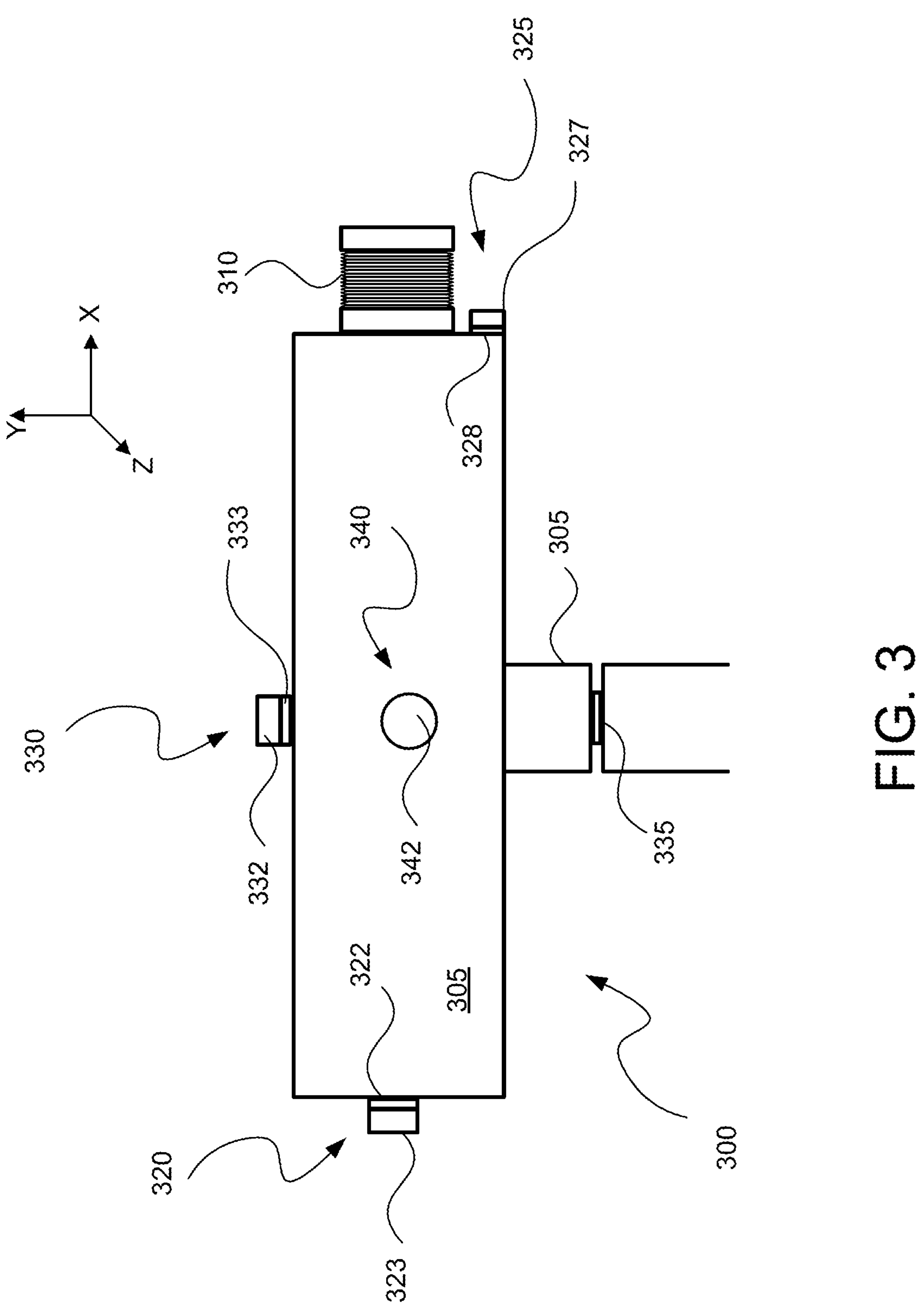
FIG. 3 is a front elevation of an example of an optical module provided with sensor and actuator pairs in accordance with one aspect of an embodiment.

Thus, referring now to FIG. 3, an LNM 300 is shown as an example of an optical component of a laser system. A chassis 305 of the LNM 300 is mechanically coupled to the laser system of which it is a part (not shown in FIG. 3) by a post 305 and a bellows 310. The LNM 300 shown in FIG. 3 also includes three pairs of piezoelectric ("PZT") actuators, and a PZT sensor. In this example the actuators are implemented as PZT actuators but one of ordinary skill in the art will readily appreciate that any suitable type of actuator may be used. The term "actuator" in this context should thus be construed broadly as encompassing any type of device or system capable of generating a mechanical force in response to a control signal. Similarly, the term "sensor" in this context should be construed broadly as encompassing any type of device or system capable of converting a mechanical force to a signal.

Figure 4:
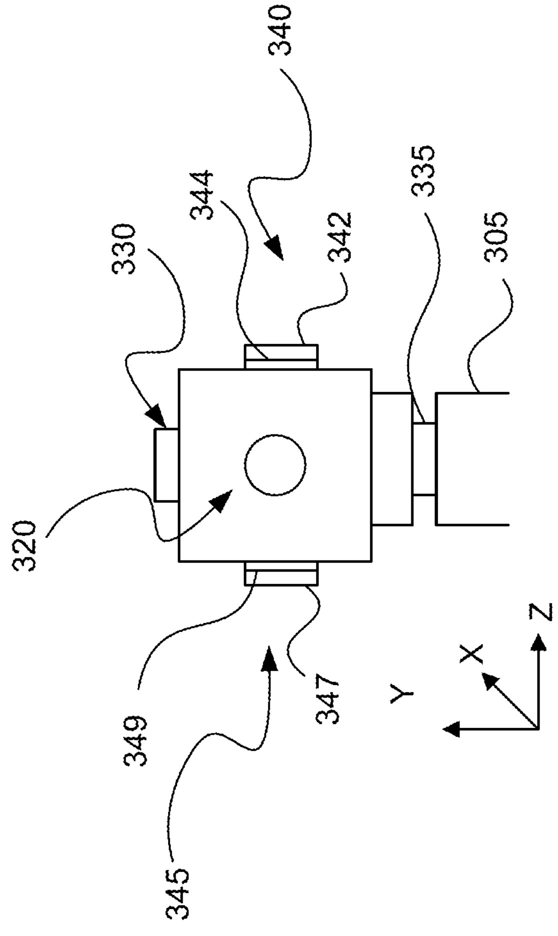
FIG. 4 is an end-on view of the optical module of FIG. 3.

Thus, there is a first PZT actuator 320 and a first PZT sensor 325. The first PZT actuator 320 is mechanical coupled to one end of the chassis 305 at a first position and the PZT sensor 325 is placed is mechanically coupled to another end of the chassis 305 at a second position displaced in the X direction from the first position. Similarly, the arrangement of FIG. 3 also includes PZT actuator 330 and a PZT sensor 335 displaced from one another in the Y direction. The arrangement shown in FIG. 3 also includes a PZT actuator 340 displaced from a PZT sensor 345 (shown in FIG. 4 which is the LNM 300 of FIG. 3 rotated 90° about the Y axis) displaced from each other in the Z direction.

While the arrangement shown in the figure senses and produces vibrations in three orthogonal dimensions, one of ordinary skill in the art will readily appreciate that an arrangement that senses and produces vibrations in only two dimensions may suffice for some applications. One of ordinary skill in the art will also appreciate the directions do not necessarily have to be orthogonal, although as mentioned above an arrangement in which the sensor/actuator pairs are arranged to sense and produce orthogonal vibrations has the advantage of reducing cross-talk.

According to another aspect of an embodiment each of the PZT elements includes a seismic mass and PZT crystal. Such a combination is referred to as a piezo-mass member. Thus, PZT actuator 320 includes a mass 323 and a PZT crystal 322. PZT sensor 325 includes a mass 327 and a PZT crystal 328. PZT actuator 330 includes a mass 332 and a PZT part 333. On the other hand, PZT sensor 335 is made up of a PZT crystal and uses the mass of the post 305 as a seismic mass. The mass 342 of PZT actuator 340 is visible in FIG. 3. The PZT crystal 344 is visible in FIG. 4. The PZT sensor 345 made up of mass 347 and PZT crystal 349 are also visible in FIG. 4. The masses are provided in the sensors, for example, to load the PZT crystals when the sensor experiences vibration.

The PZT sensor 335 in the post 305 below the LNM 300 and the PZT actuator 330 above the LNM 300 are responsible, for example, for actively cancelling the noise in the Y direction. One of ordinary skill in the art will appreciate that the PZT actuator 330 does not have to be placed above the LNM 300 but can instead be placed below the LNM 300 and close to the PZT sensor 335 to minimize higher order vibration modes. The same is true of the other two sensor/actuator pairs.

According to another aspect of an embodiment, the sensors are used to detect the waveform of vibrations of the LNM 300 for the purposes of determining the parameters, e.g., frequency/wavelength, amplitude, phase, and directionality, of counteracting active signals which will oppose the vibrations. In some embodiments the measurements are obtained while the laser is operating. According to another aspect of an embodiment, the resultant waveform (i.e., the actively cancelled vibration signal) is further analyzed to identify frequencies of residual vibrations (i.e., noise that remains present despite the active cancellation measures). The results of this analysis are used to develop one or more signal parameters selected to minimize the residual vibrations.

In general, the correct phase will be very close to 180 degrees. For example, the LNM chassis 305 may be composed primarily of aluminum. The speed of sound in aluminum is relatively high, i.e., on the order of 6000 meters per second, and the wavelength of the vibrations of the LNM chassis 305 are generally in the acoustic range. Therefore the wavelength of these acoustic waves is much larger than the size of the LNM 300 which makes the correct phase of the residual opposing waveform about 180 degrees even in cases where the location of the actuator and the sensor are not the same.

In other words, in addition to generating the opposing waveforms for active noise cancellation, in accordance with an aspect of an embodiment the standard deviation or sigma of the wavelength spectrum obtained when the laser vibrations are actively suppressed is analyzed for residual vibration frequencies. This is referred to herein as analyzing in wavelength sigma. Signals opposing these residual vibration frequencies are then added to the active noise suppression signal. The wavelength/frequency, phase, amplitude, and the direction of these anti residual vibration signals are selected to minimize the remaining vibrations.

The signals opposing the residual vibration frequencies can be generated by performing sweeps in amplitude (i.e., varying amplitude while holding frequency constant for each sweep) for the identified residual frequencies and their harmonics in two or three directions, while the laser is firing, to minimize the residual frequencies. The minimization can be performed using an optimization technique such as gradient descent optimization where the cost function is the function describing the vibrations and the first-order derivative of the cost function is used to find the minimum. The minimization can also be performed using heuristic methods or even a system using a feed forward algorithm for more effective cancellation.

Figure 5:
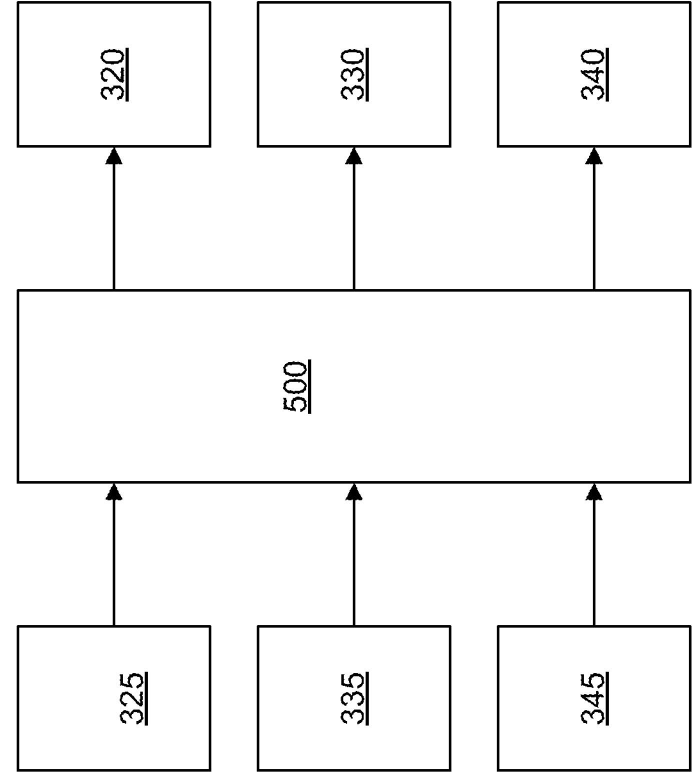
FIG. 5 is a functional block diagram of a system for reducing vibrations in an optical module in accordance with one aspect of an embodiment.

FIG. 5 is a functional block diagram of an antivibration system according to an aspect of an embodiment. As shown in FIG. 5, the respective outputs of the X direction PZT sensor 325, of the Y direction PZT sensor 335, and of the Z direction PZT sensor 345 are supplied as inputs to a waveform analysis and generation module 500. The waveform analysis and generation module 500 uses the inputs from the sensors to determine the parameters, e.g., one or more of the amplitude, frequency, direction, and phase of a waveform for an active noise cancellation signal. The waveform analysis and generation module 500 also uses these inputs to analyze in sigma wavelength the spectrum of the vibrations which still exist despite application of the active noise cancellation signal. In other words, the sigma of the wavelength is analyzed for vibrational frequencies that still may be affecting wavelength and bandwidth stability. The waveform analysis and generation module 500 then identifies these residual vibrations and determines the parameters of signals to be applied to the X, Y, and Z PZT actuators 320, 330, and 340, respectively, to reduce the residual vibrations.

Figure 6:
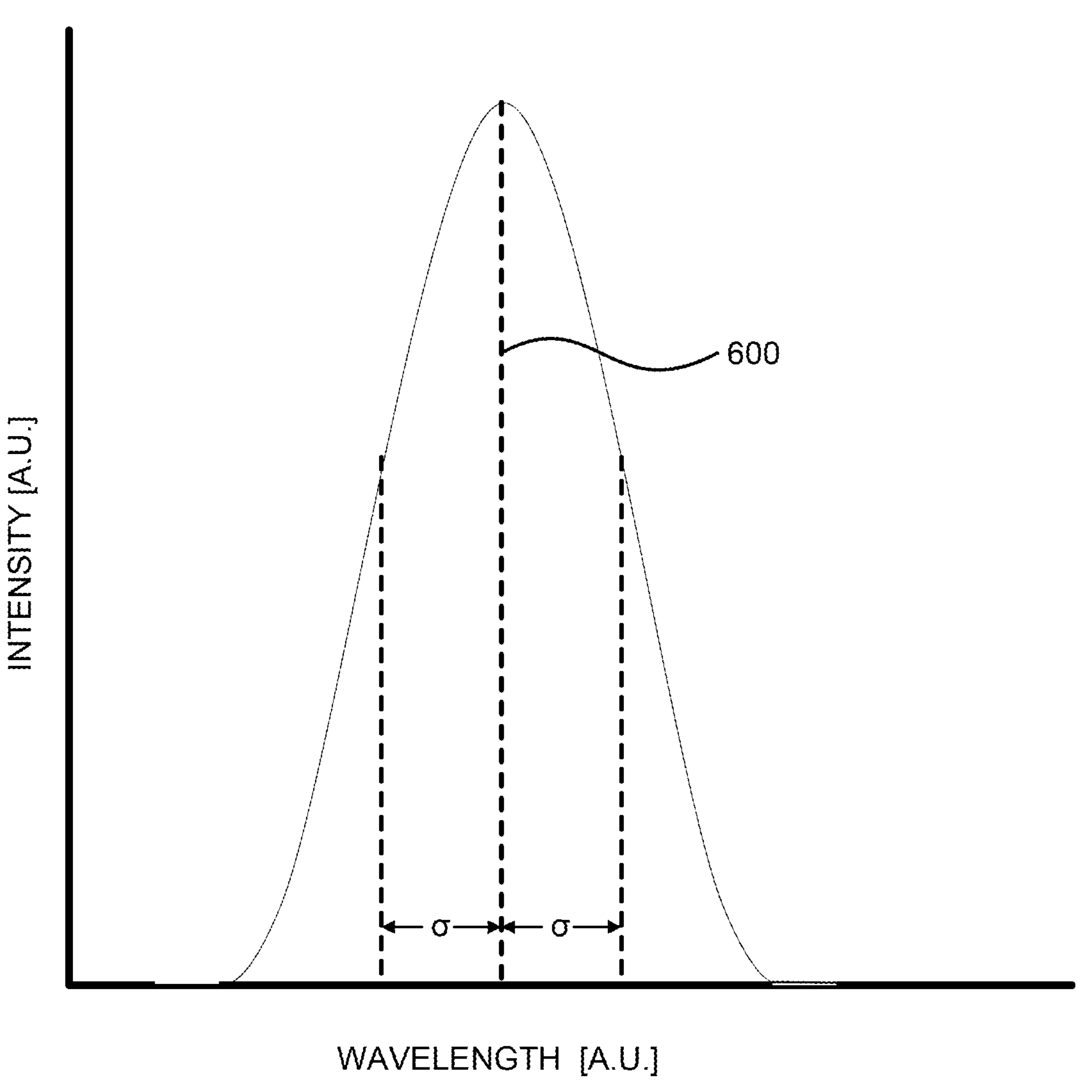
FIG. 6 is a graph of an example of a wavelength spectrum of vibrations in an optical module.

FIG. 6 is a graph illustrating some principles of analyzing signals in sigma wavelength. The graph of FIG. 6 is a plot of wavelength of the vibrations in arbitrary units against the intensity of the vibrations at that wavelength, also in arbitrary units. This plot will generally assume the form of a Gaussian or a bell-shaped curve. As is well known, the distance $\sigma$ laterally in both directions from the center line 600 is the standard deviation of this plot and captures about 68% of the area under the curve. In accordance with an aspect of an embodiment, wavelengths in this range are identified to find to identify residual vibrations.

Figure 7:
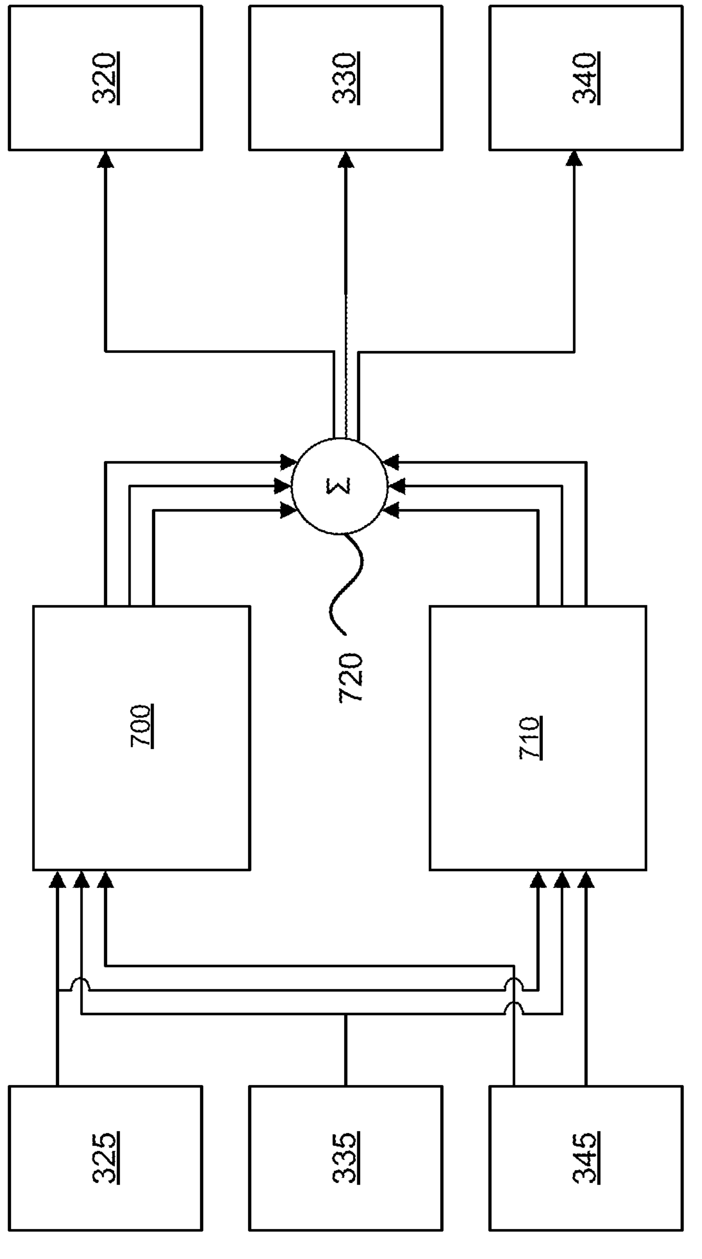
FIG. 7 is a functional block diagram of another system for reducing vibrations in an optical module in accordance with one aspect of an embodiment.

FIG. 7 is also a functional block diagram of an antivibration system in accordance with another aspect of an embodiment. In the arrangement shown in FIG. 7, the signal from the X direction sensor 325 is supplied both to an active noise canceling waveform generator 700 and to a residual cancellation waveform generator 710. The signal from the Y direction sensor 335 is also supplied to both of these waveform generators as is the signal from the Z direction sensor 345. The active noise cancelling waveform generator 700 uses the inputs to generate active noise canceling waveforms for each direction which noise canceling waveforms are supplied to a summing node 720. At the same time, the residual cancellation waveform generator 710 analyzes the inputs it receives from the sensors in sigma wavelength to determine the wavelengths of residual vibrations in the sensed vibration signal. These signals, one for each direction, are also supplied to the summing node 720. The summing node 720 adds the signals from the active noise canceling waveform generator 700 and the residual cancellation waveform generator 710 for each direction and then supplies as outputs a signal to the actuator 320, a signal to the actuator 330, and a signal to the actuator 340, respectively.

Figure 8:
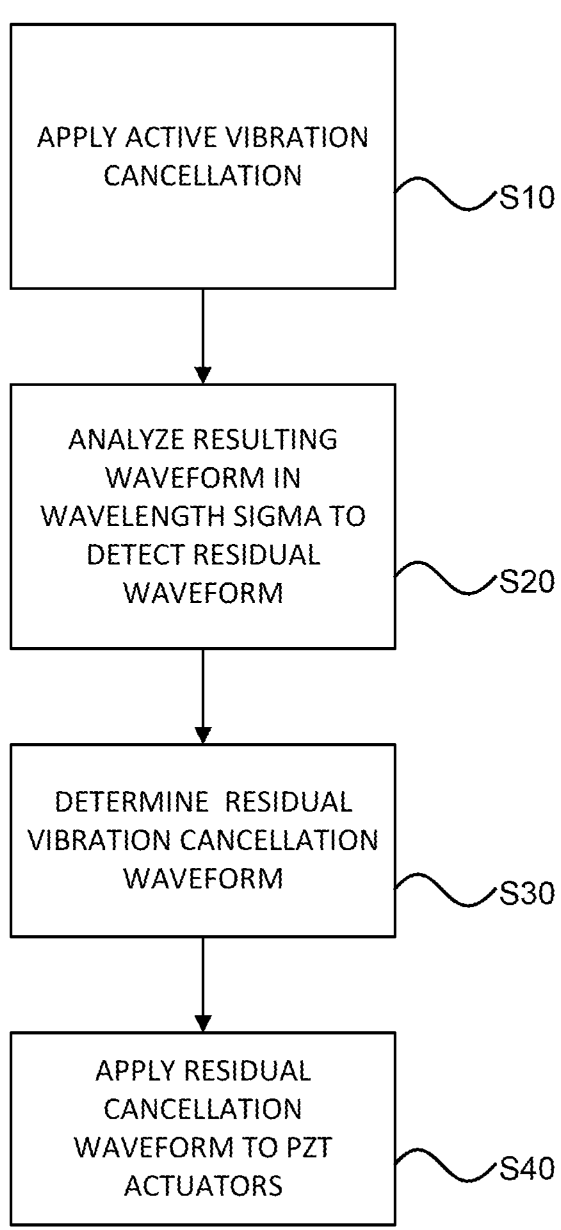
FIG. 8 is a flow chart of a method for reducing vibrations in an optical module in accordance with one aspect of an embodiment.

FIG. 8 is a flow chart of a method of suppressing vibrations in accordance with an aspect of an embodiment. In a step S10 active vibration cancellation is applied as described above. Then, in a step S20 the resulting waveform of the vibrations is analyzed in wavelength sigma to determine the waveform of any residual vibrations. In a step S30 the residual vibration cancellation waveform is determined. In other word, parameters such as the phase and direction of the residual vibration cancellation waveform are determined. In a step S40 the residual cancellation waveform is applied to the PZT actuators which are mechanically coupled to the object for which vibration suppression is desired, for example, an LNM. Although in the method described in connection with FIG. 8 the residual waveform is determined after the active vibration cancellation waveform has been applied, one of ordinary skill in the art will readily appreciate that steps S10 and S20 can occur concurrently.

Some of the above description is in terms of functional block diagrams with some functions allocated to some blocks and other functions allocated to other blocks. It will be understood that the division between blocks and the allocations are arbitrary and that different divisions and allocations are possible so long as the overall functions are carried out as described above.

The above description includes examples of multiple embodiments. It is, of course, not possible to describe every conceivable combination of components or methodologies for purposes of describing these embodiments, but one of ordinary skill in the art may recognize that many further combinations and permutations of elements of the various embodiments are possible based on the disclosure. Accordingly, the described embodiments are intended to be representative of and disclose all such alterations, modifications, and variations that fall within the spirit and scope of the appended claims.

Furthermore, to the extent that the term "includes" is used in either the detailed description or the claims, such term is intended to be inclusive in a manner similar to the term "comprising" as "comprising" is construed when employed as a transitional word in a claim. Also, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

The embodiments can be further described using the following clauses:

1. An antivibration apparatus for a module for a lithography system, the module having a chassis, the antivibration apparatus comprising:

a first piezo-mass member mechanically coupled to the chassis to be accelerated in a first direction by a vibration waveform vibrating the chassis and adapted to generate a signal indicative of a component of the vibration waveform in the first direction;

a controller arranged to receive the signal and adapted to generate a first vibration suppression waveform based at least in part on the signal; and a second piezo-mass member mechanically coupled to the chassis and arranged to receive the first vibration suppression waveform and adapted to apply a first antivibration force to the chassis in the first direction in accordance with the first vibration suppression waveform.

2. The antivibration apparatus of clause 1 further comprising a third piezo-mass member mechanically coupled to the chassis to be accelerated in a second direction by the vibration waveform vibrating the chassis and adapted to generate a second signal indicative of a component of the vibration waveform in the second direction, the controller being arranged to receive the second signal and adapted to generate a second vibration suppression waveform based at least in part on the second signal; and a fourth piezo-mass member mechanically coupled to the chassis and arranged to receive the second vibration suppression waveform and adapted to apply a second antivibration force to the chassis in the second direction in accordance with the second vibration suppression waveform.

3. The antivibration apparatus of clause 2 wherein the first direction and the second direction are substantially orthogonal.

4. The antivibration apparatus of clause 3 further comprising a fifth piezo-mass member mechanically coupled to the chassis to be accelerated in a third direction by the vibration waveform vibrating the chassis and adapted to generate a third signal indicative of a component of the vibration waveform in the third direction, the controller being arranged to receive the third signal and adapted to generate a third vibration suppression waveform based at least in part on the third signal; and a sixth piezo-mass member mechanically coupled to the chassis and arranged to receive the third vibration suppression waveform and adapted to apply a third antivibration force to the chassis in the third direction in accordance with the third vibration suppression waveform.

5. The antivibration apparatus of clause 4 wherein the first direction, the second direction, and the third direction are substantially mutually orthogonal.

6. The antivibration apparatus of clause 1 wherein the controller is adapted to identify a residual vibration component of the signal present while the second piezo-mass member applies the first antivibration force by analyzing a wavelength of the signal in wavelength sigma, and wherein the controller is adapted to modify the first vibration suppression waveform to reduce the residual vibration component.

7. The antivibration apparatus of clause 1 wherein each of the piezo-mass members comprises a piezoelectric crystal and a seismic mass.
8. An antivibration apparatus for a module for a lithography system, the module having a chassis, the antivibration apparatus comprising:
a first sensor mechanically coupled to the chassis and arranged to sense a first directional component of a vibration waveform in a first direction and to generate a first output indicative of the first directional component;
a second sensor mechanically coupled to the chassis and arranged to sense a second directional component of a vibration waveform in a second direction different from the first direction and to generate a second output indicative of the second directional component;
a cancellation waveform generator arranged to receive the first output and the second output and to generate a first vibration cancellation waveform for the first direction based at least in part on the first output and a second vibration cancellation waveform for the second direction based at least in part on the second output;
a first actuator mechanically coupled to the chassis and arranged to receive the first vibration cancellation waveform and to generate first cancellation vibrations corresponding to the first vibration cancellation waveform in the first direction; and
a second actuator mechanically coupled to the chassis and arranged to receive the second vibration cancellation waveform and to generate second cancellation vibrations corresponding to the second vibration cancellation waveform in the second direction,
the antivibration system further comprising a residual vibration cancellation waveform generator arranged to receive the first output and the second output,
adapted to identify a first residual vibration waveform for the first direction based at least in part on the first output while the first cancellation vibration is being generated and generate a first residual vibration suppression waveform based at least in part on the first residual vibration waveform and to add the first residual vibration waveform to the first vibration cancellation waveform, and
adapted to identify a second residual vibration waveform for the second direction based at least in part on the second output while the second cancellation vibration is being generated and generate a second residual vibration suppression waveform based at least in part on the second residual vibration waveform and to add the second residual vibration waveform to the second vibration cancellation waveform.
9. The apparatus of clause 8 wherein the first sensor comprises a first sensor piezoelectric transducer and the second sensor comprises a second sensor piezoelectric transducer.
10. The apparatus of clause 9 wherein the first sensor piezoelectric transducer and the second sensor piezoelectric transducer each comprises a piezoelectric crystal and a seismic mass.
11. The apparatus of clause 8 wherein the first actuator comprises a first piezoelectric transducer and the second actuator comprises a second piezoelectric transducer.
12. The apparatus of clause 11 wherein the first piezoelectric transducer and the second piezoelectric transducer each comprises a piezoelectric crystal and a seismic mass.
13. The apparatus of clause 8 wherein the module comprises a line narrowing module.
14. The apparatus of clause 8 wherein the residual vibration cancellation waveform generator is adapted to identify the first residual vibration waveform by analyzing a wavelength of the first output in wavelength sigma and to identify the second residual vibration waveform by analyzing a wavelength of the second output in wavelength sigma.
15. The apparatus of clause 8 wherein the first direction is orthogonal to the second direction.
16. The apparatus of clause 8 further comprising:
a third sensor mechanically coupled to the chassis and arranged to sense a third directional component of a vibration waveform in a third direction different from the first direction and the second direction and to generate a third output indicative of the third directional component,
the cancellation waveform generator being arranged to receive the third output and to generate a third vibration cancellation waveform for the third direction based at least in part on the third output;
a third actuator mechanically coupled to the chassis and arranged to receive the third vibration cancellation waveform and to generate third cancellation vibrations corresponding to the third vibration cancellation waveform in the third direction,
the residual vibration cancellation waveform generator being
arranged to receive the third output,
adapted to identify a third residual vibration waveform for the third direction based at least in part on the third output while the third cancellation vibration is being generated and generate a third residual vibration suppression waveform based at least in part on the third residual vibration waveform and to add the third residual vibration waveform to the third vibration cancellation waveform.
17. An antivibration method for a module for a lithography system, the module having a chassis, the antivibration method comprising:
sensing a first directional component of a vibration waveform in a first direction and generating a first output indicative of the first directional component;
sensing a second directional component of a vibration waveform in a second direction different from the first direction and generating a second output indicative of the second directional component;
generating a first vibration cancellation waveform for the first direction based at least in part on the first output and a second vibration cancellation waveform for the second direction based at least in part on the second output;
generating first cancellation vibrations in the first direction corresponding to the first vibration cancellation waveform;
generating second cancellation vibrations in the second direction corresponding to the second vibration cancellation waveform;
identifying a first residual vibration waveform for the first direction based at least in part on the first output while the first cancellation vibration is being generated and generating a first residual vibration suppression waveform based at least in part on the first residual vibration waveform and adding the first residual vibration waveform to the first vibration cancellation waveform; and identifying a second residual vibration waveform for the second direction based at least in part on the second output while the second cancellation vibration is being generated and generating a second residual vibration suppression waveform based at least in part on the second residual vibration waveform and adding the second residual vibration waveform to the second vibration cancellation waveform.

18. The method of clause 17 wherein sensing the first directional component of the vibration waveform in the first direction and generating the first output indicative of the first directional component is performed using a first piezoelectric transducer and wherein sensing the second directional component of the vibration waveform in the second direction and generating the second output indicative of the second directional component is performed using a second piezoelectric transducer.

19. The method of clause 17 wherein generating the first cancellation vibrations in the first direction is performed using a first piezoelectric transducer and wherein generating second cancellation vibrations in the second direction is performed using a second piezoelectric transducer.

20. The method of clause 17 wherein identifying the first residual vibration waveform comprises analyzing a wavelength of the first output in wavelength sigma and wherein identifying the second residual vibration waveform comprises analyzing a wavelength of the second output in wavelength sigma.

21. The method of clause 17 wherein the first direction is orthogonal to the second direction.

22. The method of clause 17 further comprising:

sensing a third directional component of a vibration waveform in a third direction different from the first direction and the second direction and generating a third output indicative of the third directional component, generating a third vibration cancellation waveform for the third direction based at least in part on the third output;

generating third cancellation vibrations corresponding to the third vibration cancellation waveform in identifying a third residual vibration waveform for the third direction based at least in part on the third output while the third cancellation vibration is being generated; and generating a third residual vibration suppression waveform based at least in part on the third residual vibration waveform and to add the third residual vibration waveform to the third vibration cancellation waveform.

The above described implementations and other implementations are within the scope of the following claims.

The invention claimed is:

1. An antivibration apparatus for a module for a lithography system, the module having a chassis, the antivibration apparatus comprising:

a first piezo-mass member mechanically coupled to the chassis to be accelerated in a first direction by a vibration waveform vibrating the chassis and adapted to generate a signal indicative of a component of the vibration waveform in the first direction;

a controller arranged to receive the signal and adapted to generate a first vibration suppression waveform based at least in part on the signal;

a second piezo-mass member mechanically coupled to the chassis and arranged to receive the first vibration suppression waveform, the second piezo-mass member being actuated in accordance with the first vibration suppression waveform generated by the controller, regardless of any specific signal transmission path, such that the second piezo-mass member applies a first antivibration force to the chassis in response to the first vibration suppression waveform;

a third piezo-mass member mechanically coupled to the chassis to be accelerated in a second direction by the vibration waveform vibrating the chassis and adapted to generate a second signal indicative of a component of the vibration waveform in the second direction, the controller being additionally arranged to receive the second signal and adapted to generate a second vibration suppression waveform based at least in part on the second signal; and a fourth piezo-mass member mechanically coupled to the chassis and arranged to receive the second vibration suppression waveform, the fourth piezo-mass member being actuated in accordance with the second vibration suppression waveform generated by the controller, regardless of any specific signal transmission path, such that the fourth piezo-mass member applies a second antivibration force to the chassis in response to the second vibration suppression waveform.

2. The antivibration apparatus of claim 1 wherein the first direction and the second direction are substantially orthogonal.

3. The antivibration apparatus of claim 2 further comprising a fifth piezo-mass member mechanically coupled to the chassis to be accelerated in a third direction by the vibration waveform vibrating the chassis and adapted to generate a third signal indicative of a component of the vibration waveform in the third direction, the controller being arranged to receive the third signal and adapted to generate a third vibration suppression waveform based at least in part on the third signal; and a sixth piezo-mass member mechanically coupled to the chassis and arranged to receive the third vibration suppression waveform, the sixth piezo-mass member being actuated in accordance with the third vibration suppression waveform generated by the controller, regardless of any specific signal transmission path, such that the sixth piezo-mass member applies a third antivibration force to the chassis in response to the third vibration suppression waveform.

4. The antivibration apparatus of claim 1 wherein each of the piezo-mass members comprises a piezoelectric crystal and a seismic mass.

5. An antivibration apparatus for a module for a lithography system, the module having a chassis, the antivibration apparatus comprising:

a first sensor mechanically coupled to the chassis and arranged to sense a first directional component of a vibration waveform in a first direction and to generate a first output indicative of the first directional component;

a second sensor mechanically coupled to the chassis and arranged to sense a second directional component of a vibration waveform in a second direction different from the first direction and to generate a second output indicative of the second directional component;

a cancellation waveform generator arranged to receive the first output and the second output and to generate a first vibration cancellation waveform for the first direction based at least in part on the first output and a second vibration cancellation waveform for the second direction based at least in part on the second output;

a first actuator mechanically coupled to the chassis and arranged to receive the first vibration cancellation waveform and to generate first cancellation vibrations corresponding to the first vibration cancellation waveform in the first direction; and a second actuator mechanically coupled to the chassis and arranged to receive the second vibration cancellation waveform and to generate second cancellation vibrations corresponding to the second vibration cancellation waveform in the second direction, the antivibration system further comprising a residual vibration cancellation waveform generator arranged to receive the first output and the second output, adapted to identify a first residual vibration waveform for the first direction based at least in part on the first output while the first cancellation vibration is being generated and generate a first residual vibration suppression waveform based at least in part on the first residual vibration waveform and to add the first residual vibration waveform to the first vibration cancellation waveform, and adapted to identify a second residual vibration waveform for the second direction based at least in part on the second output while the second cancellation vibration is being generated and generate a second residual vibration suppression waveform based at least in part on the second residual vibration waveform and to add the second residual vibration waveform to the second vibration cancellation waveform.

6. The antivibration apparatus of claim 5 wherein the first sensor comprises a first sensor piezoelectric transducer and the second sensor comprises a second sensor piezoelectric transducer.

7. The antivibration apparatus of claim 5 wherein the first actuator comprises a first piezoelectric transducer and the second actuator comprises a second piezoelectric transducer.

8. The antivibration apparatus of claim 5 wherein the module comprises a line narrowing module.

9. The antivibration apparatus of claim 5 wherein the residual vibration cancellation waveform generator is adapted to identify the first residual vibration waveform by analyzing a wavelength of the first output in wavelength sigma and to identify the second residual vibration waveform by analyzing a wavelength of the second output in wavelength sigma.

10. The antivibration apparatus of claim 5 wherein the first direction is orthogonal to the second direction.

11. The antivibration apparatus of claim 5 further comprising:

a third sensor mechanically coupled to the chassis and arranged to sense a third directional component of a vibration waveform in a third direction different from the first direction and the second direction and to generate a third output indicative of the third directional component, the cancellation waveform generator being arranged to receive the third output and to generate a third vibration cancellation waveform for the third direction based at least in part on the third output;

a third actuator mechanically coupled to the chassis and arranged to receive the third vibration cancellation waveform and to generate third cancellation vibrations corresponding to the third vibration cancellation waveform in the third direction, the residual vibration cancellation waveform generator being arranged to receive the third output, adapted to identify a third residual vibration waveform for the third direction based at least in part on the third output while the third cancellation vibration is being generated and generate a third residual vibration suppression waveform based at least in part on the third residual vibration waveform and to add the third residual vibration waveform to the third vibration cancellation waveform.

12. An antivibration method for a module for a lithography system, the module having a chassis, the antivibration method comprising:

sensing a first directional component of a vibration waveform in a first direction and generating a first output indicative of the first directional component;

sensing a second directional component of a vibration waveform in a second direction different from the first direction and generating a second output indicative of the second directional component;

generating a first vibration cancellation waveform for the first direction based at least in part on the first output and a second vibration cancellation waveform for the second direction based at least in part on the second output;

generating first cancellation vibrations in the first direction corresponding to the first vibration cancellation waveform;

generating second cancellation vibrations in the second direction corresponding to the second vibration cancellation waveform;

identifying a first residual vibration waveform for the first direction based at least in part on the first output while the first cancellation vibration is being generated and generating a first residual vibration suppression waveform based at least in part on the first residual vibration waveform and adding the first residual vibration waveform to the first vibration cancellation waveform; and identifying a second residual vibration waveform for the second direction based at least in part on the second output while the second cancellation vibration is being generated and generating a second residual vibration suppression waveform based at least in part on the second residual vibration waveform and adding the second residual vibration waveform to the second vibration cancellation waveform.

13. The antivibration method of claim 12 wherein sensing the first directional component of the vibration waveform in the first direction and generating the first output indicative of the first directional component is performed using a first piezoelectric transducer and wherein sensing the second directional component of the vibration waveform in the second direction and generating the second output indicative of the second directional component is performed using a second piezoelectric transducer.

14. The antivibration method of claim 12 wherein generating the first cancellation vibrations in the first direction is performed using a first piezoelectric transducer and wherein generating second cancellation vibrations in the second direction is performed using a second piezoelectric transducer.

15. The antivibration method of claim 12 wherein identifying the first residual vibration waveform comprises analyzing a wavelength of the first output in wavelength sigma and wherein identifying the second residual vibration waveform comprises analyzing a wavelength of the second output in wavelength sigma.

16. The antivibration method of claim 12 wherein the first direction is orthogonal to the second direction.

17. The antivibration method of claim 12 further comprising:

sensing a third directional component of a vibration waveform in a third direction different from the first direction and the second direction and generating a third output indicative of the third directional component, generating a third vibration cancellation waveform for the third direction based at least in part on the third output;

generating third cancellation vibrations corresponding to the third vibration cancellation waveform in the third direction, identifying a third residual vibration waveform for the third direction based at least in part on the third output while the third cancellation vibration is being generated; and generating a third residual vibration suppression waveform based at least in part on the third residual vibration waveform and to add the third residual vibration waveform to the third vibration cancellation waveform.

18. An antivibration apparatus for a module for a lithography system, the module having a chassis, the antivibration apparatus comprising:

a first piezo-mass member mechanically coupled to the chassis to be accelerated in a first direction by a vibration waveform vibrating the chassis and adapted to generate a signal indicative of a component of the vibration waveform in the first direction;

a controller arranged to receive the signal and adapted to generate a first vibration suppression waveform based at least in part on the signal; and a second piezo-mass member mechanically coupled to the chassis and arranged to receive the first vibration suppression waveform, the second piezo-mass member being actuated in accordance with the first vibration suppression waveform generated by the controller, regardless of any specific signal transmission path, such that the second piezo-mass member applies a first antivibration force to the chassis in response to the first vibration suppression waveform, the controller being adapted to identify a residual vibration component of the signal present while the second piezo-mass member generates the first antivibration force by analyzing a wavelength of the signal in wavelength sigma, and to modify the first vibration suppression waveform to reduce the residual vibration component.

* * * * *